(12) United States Patent
Finnigan et al.

(10) Patent No.: US 7,701,219 B2
(45) Date of Patent: Apr. 20, 2010

(54) CAPACITOR SWITCHES FOR NMR

(75) Inventors: James Finnigan, Saratoga, CA (US); Joseph Murphy, South San Francisco, CA (US)

(73) Assignee: Varian, Inc., Palo Alto, CA (US)

( * ) Notice: Subject to any disclaimer, the term of this patent is extended or adjusted under 35 U.S.C. 154(b) by 828 days.

(21) Appl. No.: 10/592,723

(22) PCT Filed: Sep. 3, 2004

(86) PCT No.: PCT/US2004/028757
§ 371 (c)(1),
(2), (4) Date: Sep. 14, 2006

(87) PCT Pub. No.: WO2005/103749
PCT Pub. Date: Nov. 3, 2005

(65) Prior Publication Data
US 2009/0184710 A1      Jul. 23, 2009

Related U.S. Application Data

(60) Provisional application No. 60/558,339, filed on Mar. 31, 2004.

(51) Int. Cl.
*G01V 3/00* (2006.01)
(52) U.S. Cl. ..................... 324/322; 324/318
(58) Field of Classification Search ................. 324/322, 324/318
See application file for complete search history.

(56) References Cited

U.S. PATENT DOCUMENTS

| 4,710,719 | A | | 12/1987 | Doty |
| 4,783,629 | A | * | 11/1988 | Arakawa et al. ............ 324/322 |
| 5,036,426 | A | | 7/1991 | Shen |
| 5,081,418 | A | | 1/1992 | Hayes et al. |
| 5,274,330 | A | | 12/1993 | Rindlisbacher et al. |
| 5,986,455 | A | | 11/1999 | Magnuson |
| 6,204,665 | B1 | | 3/2001 | Triebe et al. |
| 6,323,647 | B1 | | 11/2001 | Anderson et al. |
| 7,064,549 | B1 | * | 6/2006 | Hudson ...................... 324/318 |
| 7,132,829 | B2 | * | 11/2006 | Hudson et al. .............. 324/318 |
| 7,446,530 | B2 | * | 11/2008 | Goetz et al. ................. 324/318 |

* cited by examiner

*Primary Examiner*—Louis M Arana
(74) *Attorney, Agent, or Firm*—Edward H. Berkowitz; Bella Fishman

(57) ABSTRACT

NMR (Nuclear Magnetic Resonance) capacitor switches allow for adjusting the resonant frequency ranges of NMR measurement circuits by inserting or removing capacitors having different values into the circuits. A change of position of a single switching member is used to change the contact state of at least two capacitors. In some embodiments, at least two pairs of external contacts are disposed at distinct longitudinal levels along a channel, and a slider including multiple longitudinally-spaced capacitors is moved longitudinally within the channel to establish electrical contact between the external contact pairs and different capacitors along the slider. In other embodiments, two capacitor columns are disposed along the channel, and a movable longitudinal member establishes electrical contact between the two columns at different longitudinal levels along the columns. In some embodiments, capacitor covers or intracapacitor blocks are provided to protect the capacitors. An auxiliary inductor may also be inserted into the circuits.

14 Claims, 8 Drawing Sheets

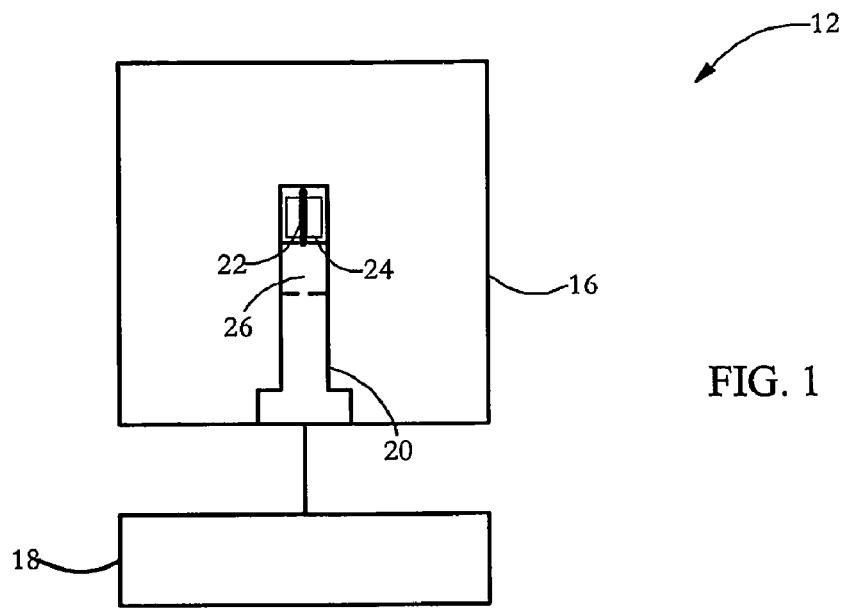
FIG. 1
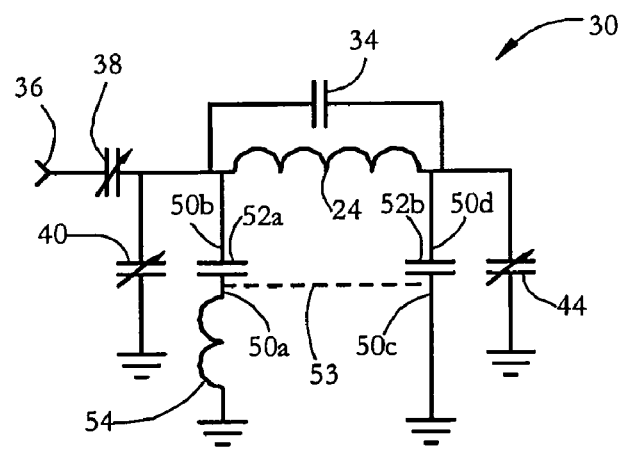
FIG. 2-A
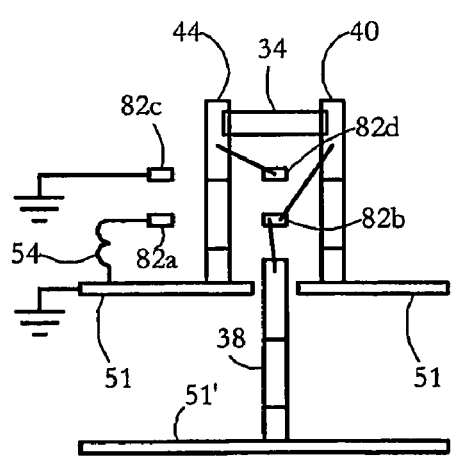
FIG. 2-B

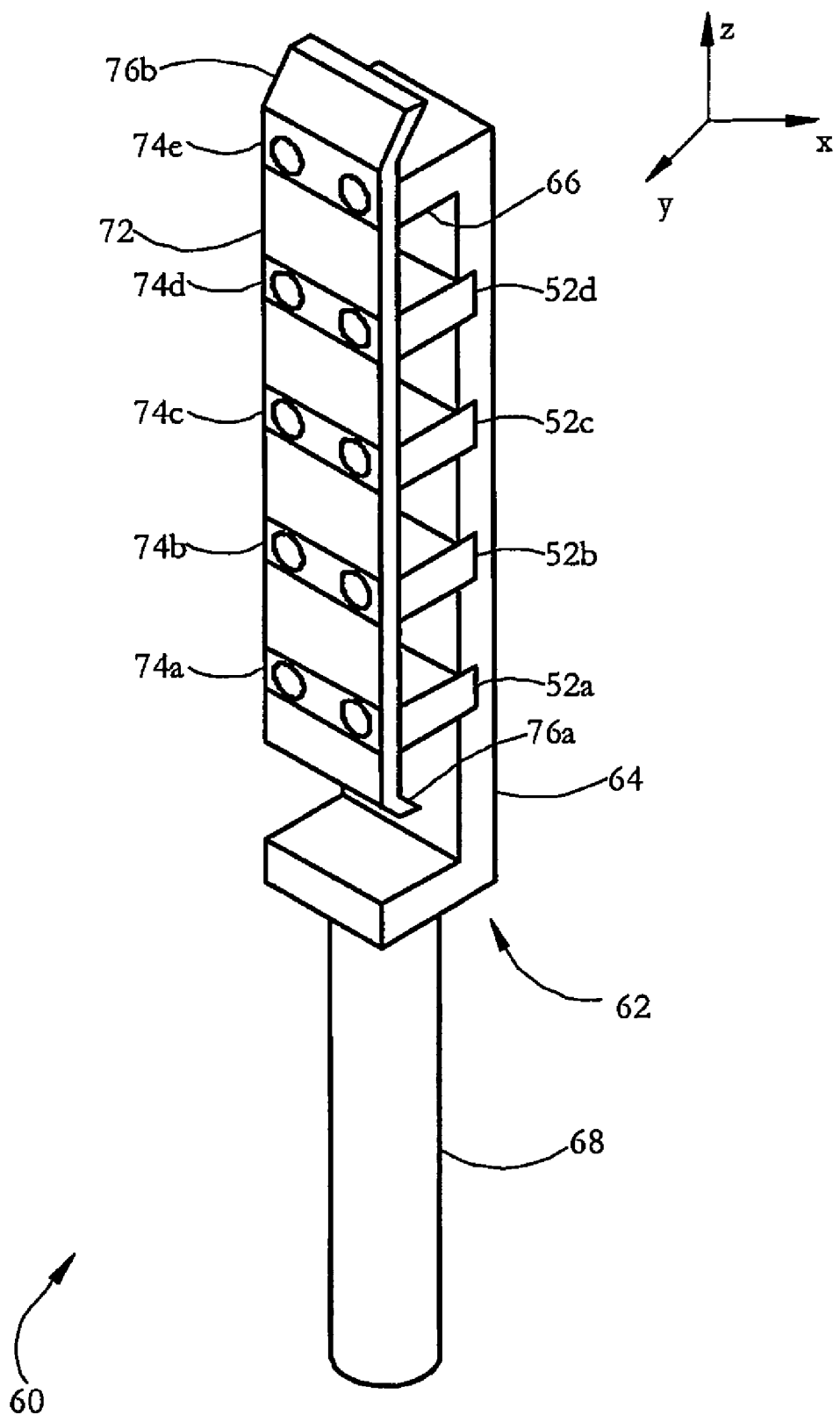
FIG. 3-A

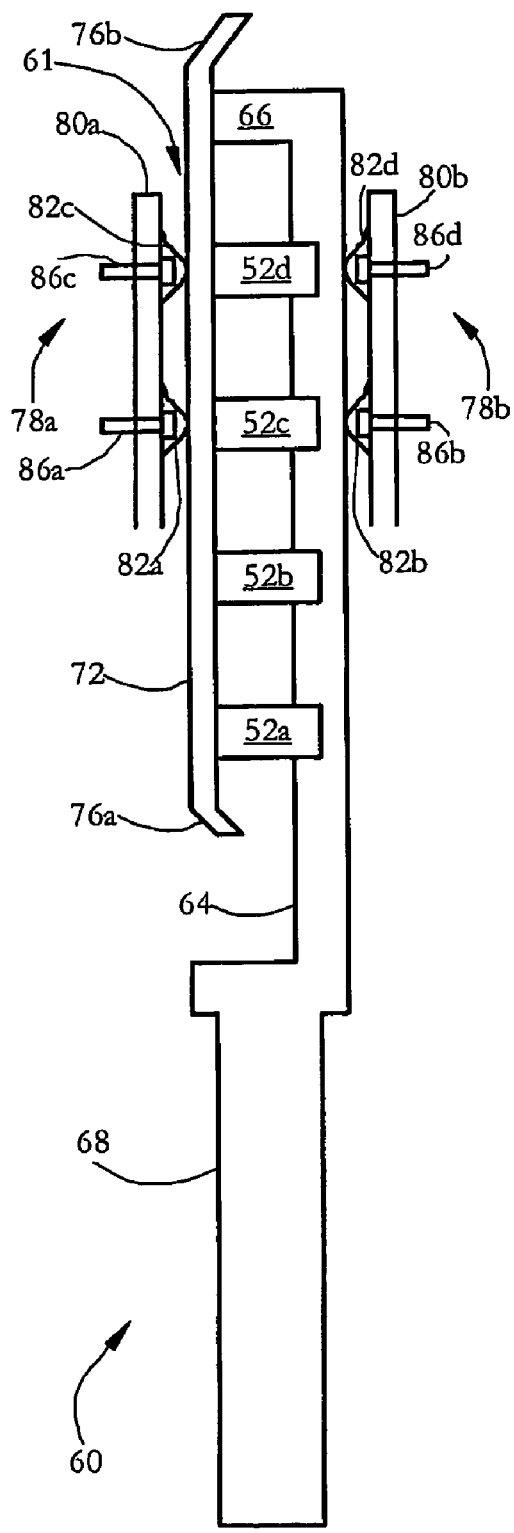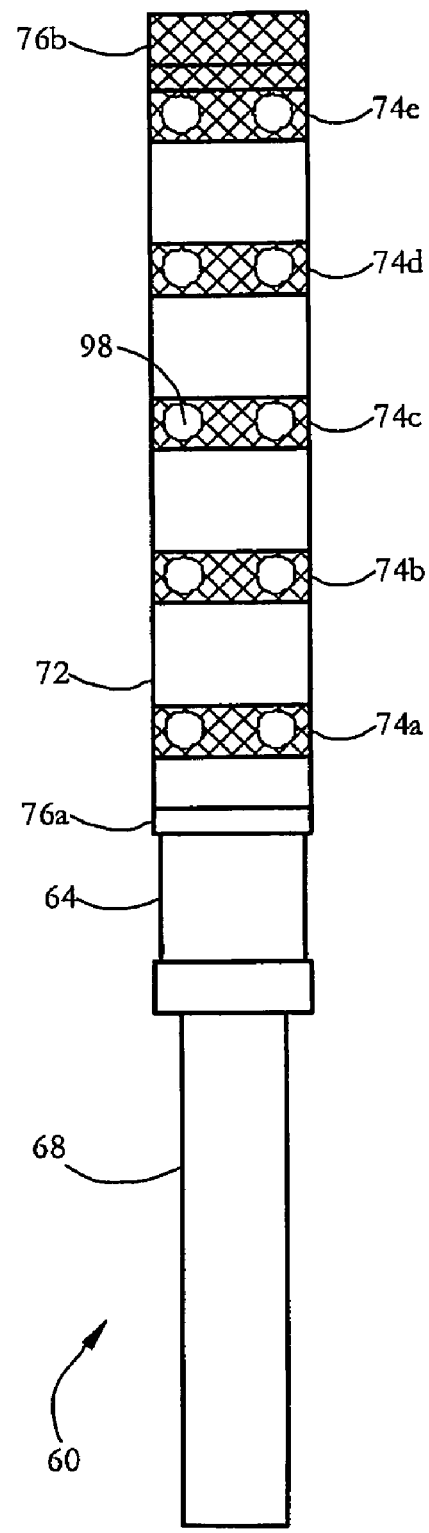
FIG. 3-B  FIG. 3-C

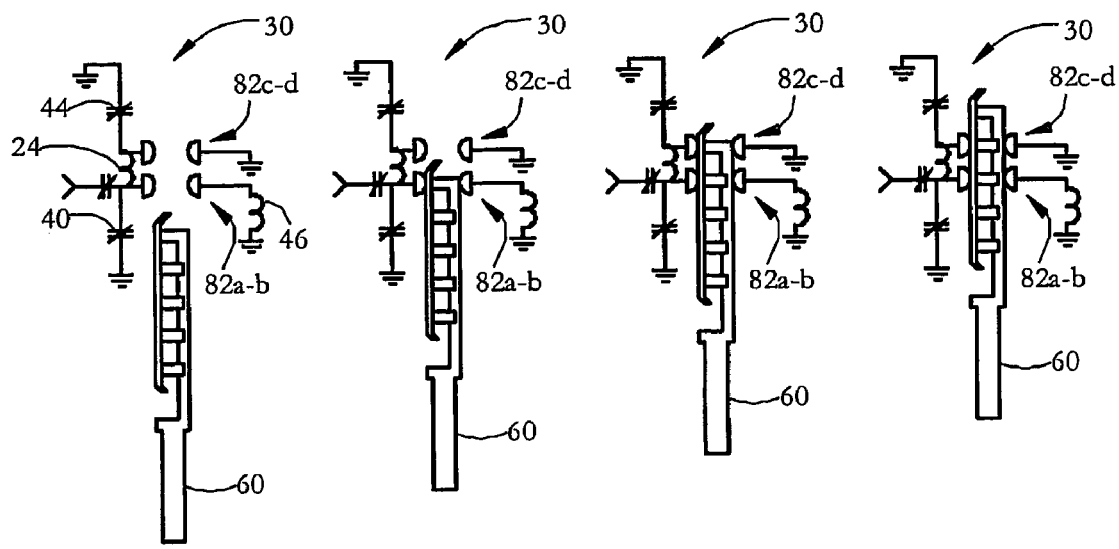
FIG. 4-A    FIG. 4-B    FIG. 4-C    FIG. 4-D
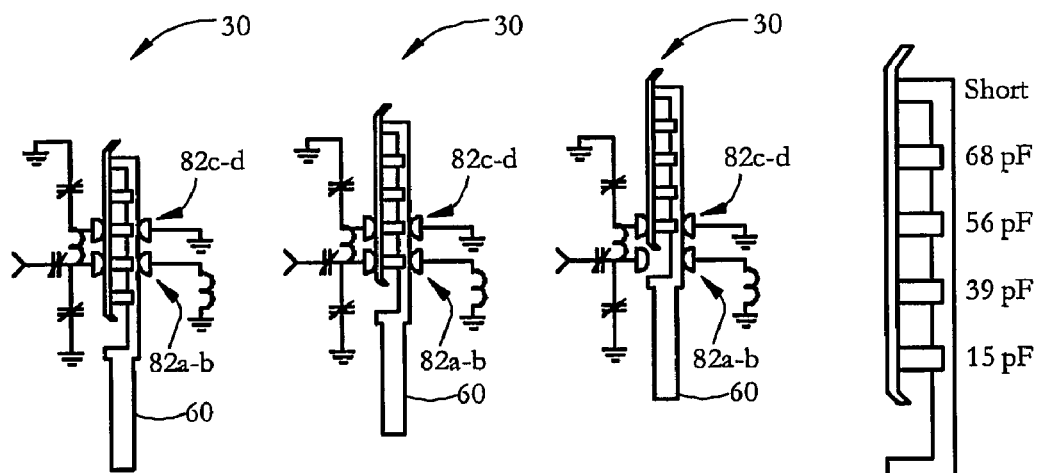
FIG. 4-E    FIG. 4-F    FIG. 4-G
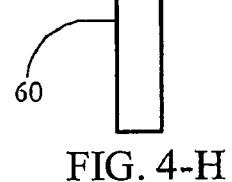
FIG. 4-H

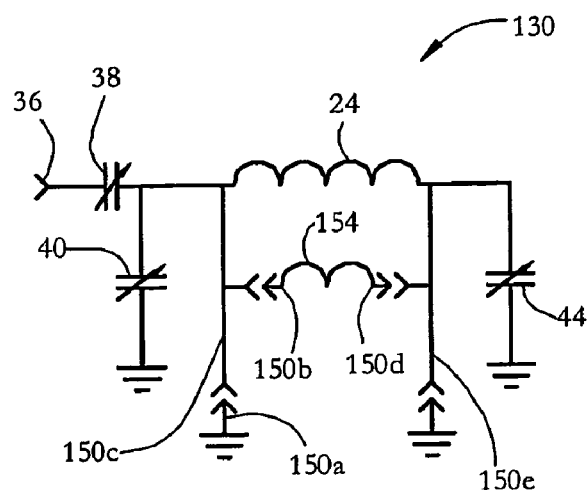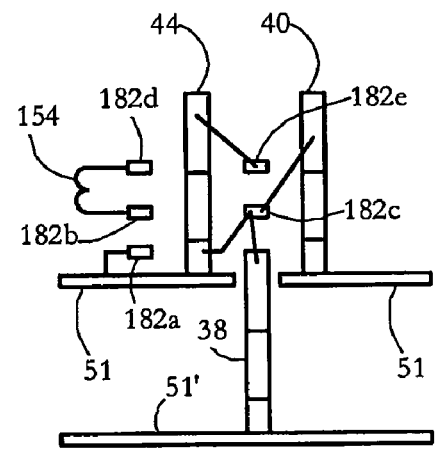
FIG. 5-A
FIG. 5-B
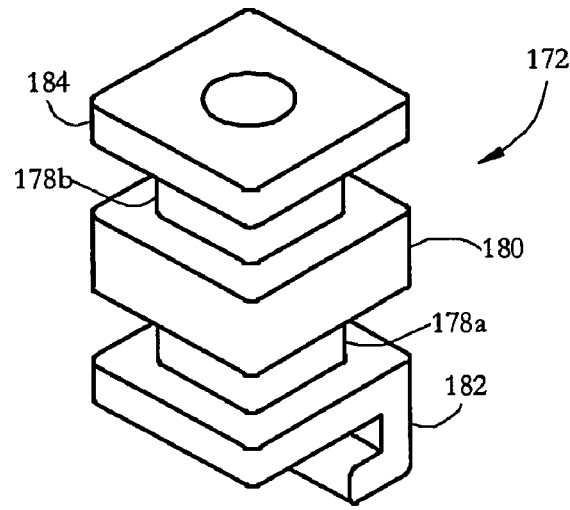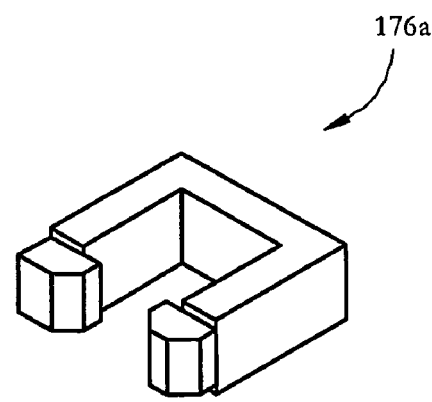
FIG. 6-C
FIG. 6-D

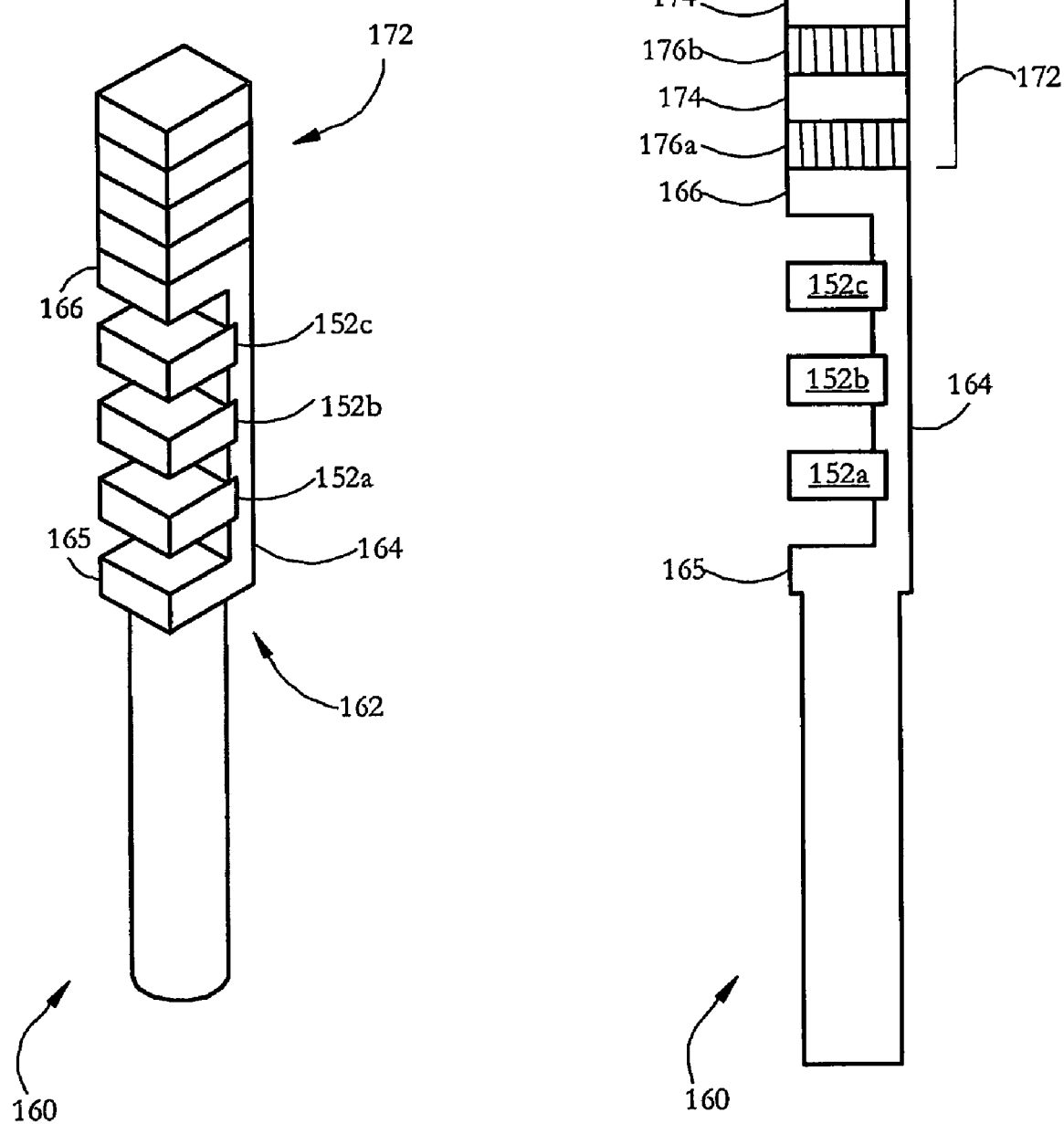
FIG. 6-A
FIG. 6-B

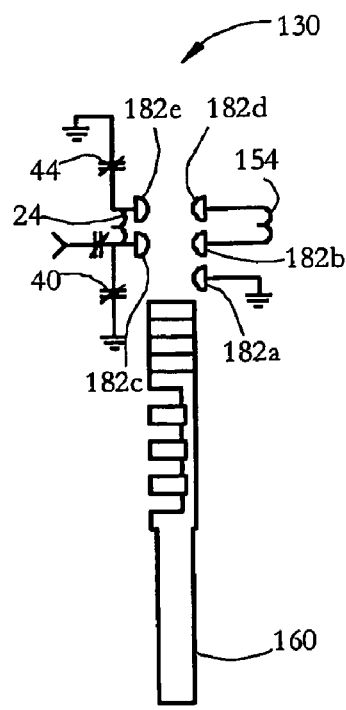
FIG. 7-A
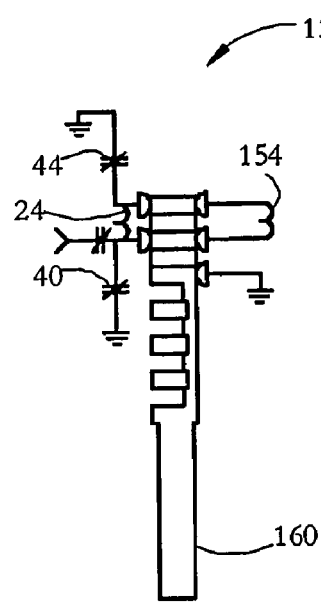
FIG. 7-B
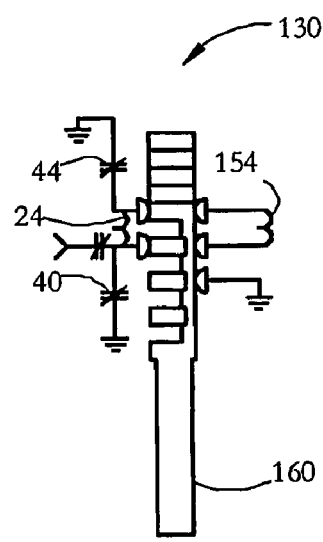
FIG. 7-C
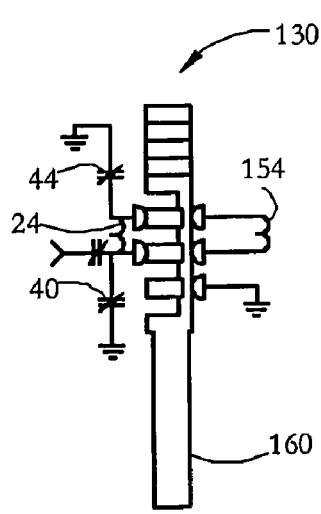
FIG. 7-D
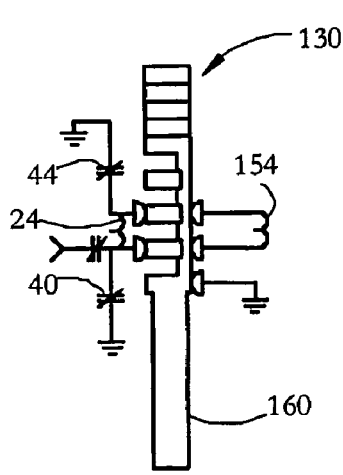
FIG. 7-E
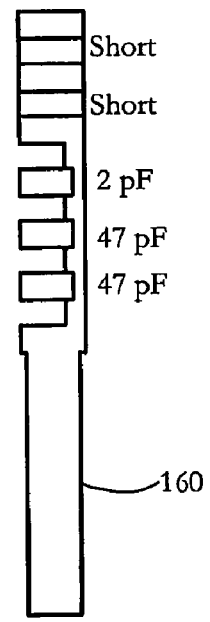
FIG. 7-F

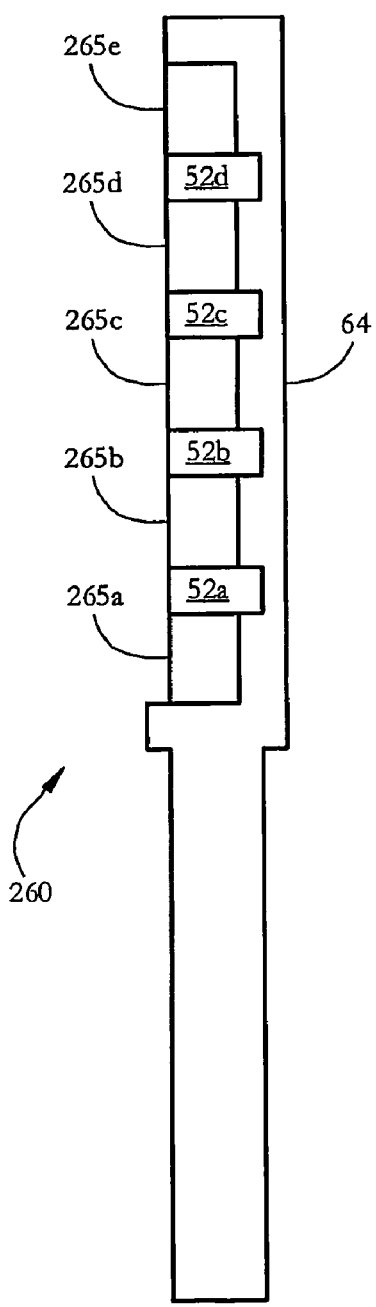
FIG. 8
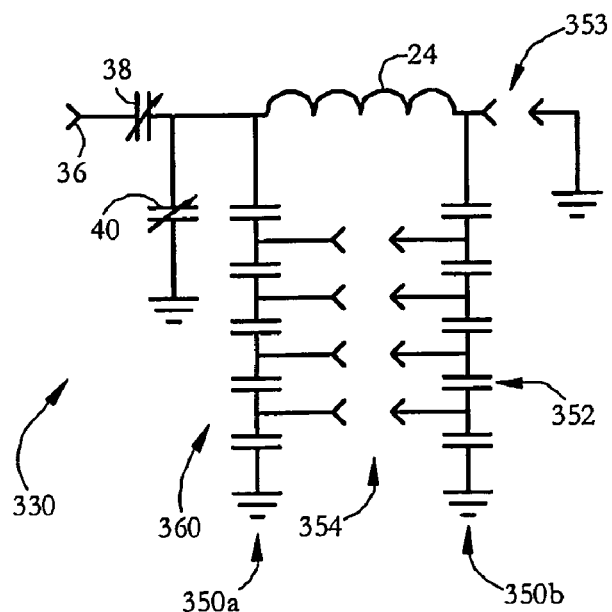
FIG. 9-A
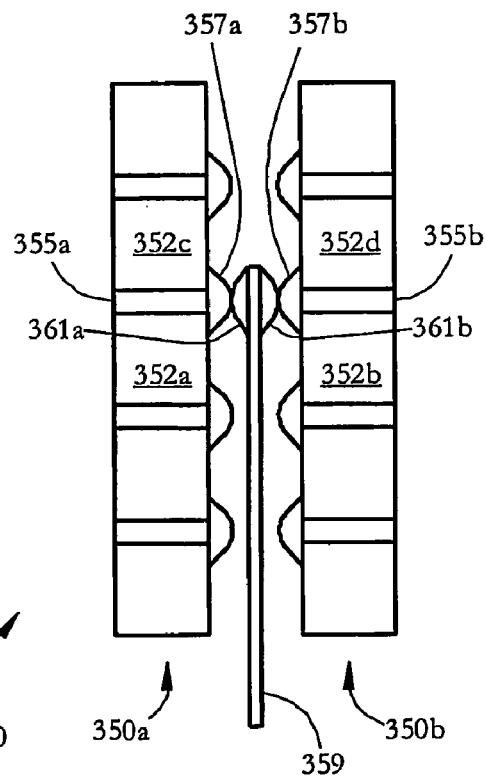
FIG. 9-B

CAPACITOR SWITCHES FOR NMR

RELATED APPLICATION DATA

This application claims priority from U.S. Provisional Patent Application No. 60/558,339, filed Mar. 31, 2004.

FIELD OF THE INVENTION

The invention in general relates to nuclear magnetic resonance (NMR) spectroscopy, and in particular to systems and methods for adjusting the resonant frequencies of NMR measurement circuits.

BACKGROUND OF THE INVENTION

Nuclear magnetic resonance (NMR) spectrometers typically include a superconducting magnet for generating a static magnetic field $B_0$, and one or more special-purpose radio-frequency (RF) coils for generating a time-varying magnetic field $B_1$ perpendicular to the field $B_0$, and for detecting the response of a sample to the applied magnetic fields. Each RF coil and associated circuitry can resonate at the Larmor frequency of a nucleus of interest present in the sample. The RF coils are typically provided as part of an NMR probe, and are used to analyze samples situated in sample tubes or flow cells. The direction of the static magnetic field $B_0$ is commonly denoted as the z-axis, while the plane perpendicular to the z-axis is commonly termed the x-y or θ-plane.

The frequency of interest is determined by the nucleus of interest and the strength of the applied static magnetic field $B_0$. In order to maximize the accuracy of NMR measurements, the resonant frequency of the excitation/detection circuitry is set to be equal to the frequency of interest. The resonant frequency of the excitation/detection circuitry is generally $$v = \sqrt{LC} \quad [1]$$

where L and C are the effective inductance and capacitance, respectively, of the excitation/detection circuitry.

Additionally, in order to maximize the transfer of RF energy into the RF coils, the impedance of each coil is matched to the impedance of the transmission line and associated components used to couple RF energy into the coil. If the coil is not impedance-matched, a sub-optimal fraction of the RF energy sent to the coil actually enters the coil. The rest of the energy is reflected out, and does not contribute to the NMR measurements.

Several approaches have been proposed for adjusting the circuitry of NMR spectrometers to achieve desired resonance frequency tuning or impedance matching. For example, in U.S. Pat. No. 6,204,665, Triebe et al. describe an NMR probe including movable adjustment rods for tuning the resonant frequency of the probe resonator. The probe also includes an actuator for performing remotely-controlled adjustments of electrical and or mechanical units such as variable resistors, inductors, and trimmer capacitors. In U.S. Pat. No. 5,986,455, Magnuson describes a tuning apparatus including a plurality of capacitors which can be switched into a tuning circuit by controllable switches. In U.S. Pat. No. 5,081,418, Hayes et al. describe a method of tuning a radio-frequency coil by connecting sections of the coil to ground.

SUMMARY OF THE INVENTION

According to one aspect, the present invention provides a nuclear magnetic resonance apparatus including a nuclear magnetic resonance sample coil, and a switching assembly electrically connected to the sample coil, wherein the switching assembly comprises: a first pair of contacts disposed along a longitudinal channel, at least one contact of the first pair of contacts being electrically connected to the sample coil; a second pair of contacts disposed along the longitudinal channel and spaced apart longitudinally relative to the first pair of contacts, at least one contact of the second pair of contacts being electrically connected to the sample coil, and a longitudinally-movable switching member comprising a plurality of longitudinally-spaced capacitors. The switching member is positioned in the longitudinal channel such that different capacitors of the plurality of capacitors are capable of being inserted between the first pair of contacts and between the second pair of contacts. A longitudinal motion of the switching member alters a contact state of at least two of the plurality of the capacitors with the first pair of contacts and the second pair of contacts, thereby adjusting a resonant frequency of a nuclear magnetic resonance measurement circuit including the sample coil.

According to another aspect, a switching assembly electrically connected to the sample coil comprises: a first longitudinal capacitor column comprising a plurality of first capacitors connected in series, and a plurality of transversely-protruding first contacts connected to a corresponding plurality of intercapacitor interfaces defined between the first capacitors; a second longitudinal capacitor column comprising a plurality of second capacitors connected in series, and a plurality of transversely-protruding second contacts connected to a corresponding plurality of intercapacitor interfaces defined between the second capacitors, the second capacitor column being aligned with and transversely spaced relative to the first capacitor column; and a longitudinally-movable switching member positioned in a switching channel defined between the first capacitor column and the second capacitor column. The switching member selectively establishes an electrical connection between a selected first contact and a selected second contact when positioned between the selected first contact and the selected second contact.

BRIEF DESCRIPTION OF THE DRAWINGS

The foregoing aspects and advantages of the present invention will become better understood upon reading the following detailed description and upon reference to the drawings where:

FIG. 1 is a schematic diagram of an exemplary NMR spectrometer according to an embodiment of the present invention.

FIG. 2-A is a schematic diagram of a tunable NMR probe circuit according to an embodiment of the present invention.

FIG. 2-B shows a side view of an arrangement of some of the components of the circuit of FIG. 2-A, according to an embodiment of the present invention.

FIG. 3-A shows an isometric view of a movable capacitance-switching member suited for use in the circuit of FIG. 2-A, according to an embodiment of the present invention.

FIG. 3-B shows a longitudinal side view of the switching member of FIG. 3-A and part of its probe environment, according to an embodiment of the present invention.

FIG. 3-C shows another longitudinal side view of the switching member of FIG. 3-A, from a direction perpendicular to that of FIG. 3-B.

FIGS. 4-A-G illustrate schematically several sequential positions of the switching member of FIGS. 3-A-C and the switching circuits corresponding to the switching member positions, according to an embodiment of the present invention.

FIG. 4-H shows a set of capacitor values chosen for the switching member illustrated in FIGS. 4-A-G, according to an embodiment of the present invention.

FIG. 5-A is a schematic diagram of a tunable NMR probe circuit according to another embodiment of the present invention.

FIG. 5-B shows a side view of an arrangement of some of the components of the circuit of FIG. 5-A, according to an embodiment of the present invention.

FIG. 6-A shows an isometric view of a movable capacitance-switching member suited for use in the circuit of FIG. 5-A, according to an embodiment of the present invention.

FIG. 6-B shows a longitudinal side view of the switching member of FIG. 3-A according to an embodiment of the present invention.

FIG. 6-C shows an isometric view of an insulative extension of the switching member of FIG. 6-A, according to an embodiment of the present invention.

FIG. 6-D shows an isometric view of a conductive contact clip that can be mounted on the insulative extension of FIG. 6-C, according to an embodiment of the present invention.

FIGS. 7-A-E illustrate schematically several sequential positions of the switching member of FIGS. 6-A-B and the switching circuits corresponding to the switching member positions, according to an embodiment of the present invention.

FIG. 7-F shows a set of capacitor values chosen for the switching member illustrated in FIGS. 7-A-E, according to an embodiment of the present invention.

FIG. 8 shows a longitudinal view of a capacitance-switching member according to another embodiment of the present invention.

FIG. 9-A shows a longitudinal view of a switching circuit according to yet another embodiment of the present invention.

FIG. 9-B is a schematic diagram of a capacitance-switching assembly suited for use in the circuit of FIG. 9-A, according to an embodiment of the present invention.

DETAILED DESCRIPTION OF THE INVENTION

In the following description, a set of elements includes one or more elements. Any reference to an element is understood to encompass one or more elements. Each recited element or structure can be formed by or be part of a monolithic structure, or be formed from multiple distinct structures. The statement that a coil is used to perform a nuclear magnetic measurement on a sample is understood to mean that the coil is used as transmitter, receiver, or both. Any recited electrical or mechanical connections can be direct connections or indirect connections through intermediary circuit elements or structures.

The following description illustrates embodiments of the invention by way of example and not necessarily by way of limitation.

FIG. 1 is a schematic diagram illustrating an exemplary nuclear magnetic resonance (NMR) spectrometer 12 according to an embodiment of the present invention. Spectrometer 12 comprises a magnet 16, an NMR probe 20 inserted in a cylindrical bore of magnet 16, and a control/acquisition system 18 electrically connected to magnet 16 and probe 20. Probe 20 includes one or more radio-frequency (RF) coils 24 and associated electrical circuit components. For simplicity, the following discussion will focus on a single coil 24, although it is understood that a system may include other similar coils. A sample container 22 is positioned within probe 20, for holding an NMR sample of interest within coil 24 while measurements are performed on the sample. Sample container 22 may be a sample tube or a flow cell. A number of electrical circuit components such as capacitors, inductors, and other components are situated in a circuit region 26 of probe 20, and are connected to coil 24. Coil 24 and the various components connected to coil 24 form one or more NMR measurement circuits. Circuit region 26 is situated adjacent to coil 24, immediately underneath coil 24.

To perform a measurement, a sample is inserted into a measurement space defined within coil 24. Magnet 16 applies a static magnetic field $B_0$ to the sample held within sample container 22. Control/acquisition system 18 comprises electronic components configured to apply desired radio-frequency pulses to probe 20, and to acquire data indicative of the nuclear magnetic resonance properties of the samples within probe 20. Coil 24 is used to apply radio-frequency magnetic fields $B_1$ to the sample, and/or to measure the response of the sample to the applied magnetic fields. The RF magnetic fields are perpendicular to the static magnetic field. The same coil may be used for both applying an RF magnetic field and for measuring the sample response to the applied magnetic field. Alternatively, one coil may be used for applying an RF magnetic field, and another coil for measuring the response of the sample to the applied magnetic field.

A single coil may be used to perform measurements at multiple frequencies, by tuning the resonant frequency of the NMR measurement circuit that includes the coil. In an exemplary NMR system, $^{13}C$ nuclei correspond to a frequency of about 125 MHz, and $^{31}P$ nuclei to a frequency of 202 MHz. An NMR probe suitable for taking measurements for both $^{13}C$ and $^{31}P$ nuclei in such a system may be capable of having its resonant frequency tuned along a range including the frequency span between 125 MHz and 202 MHz. Another nucleus of common interest in NMR applications is $^{15}N$.

FIG. 2-A shows a schematic diagram of a tunable NMR measurement circuit 30 in an exemplary switching configuration according to an embodiment of the present invention. Measurement circuit 30 includes an NMR sample coil 24, and associated components including an auxiliary inductor and a number of capacitors connected to sample coil 24. A capacitor 34 may be connected in parallel with sample coil 24, if needed to bring the resonant frequency of circuit 30 within a desired range. An input terminal 36 receives external excitation pulses. A continuously-variable impedance-matching capacitor 38 is connected between input terminal 36 and the input (proximal) side of sample coil 24. The capacitance of capacitor 38 may be adjusted in order to optimize the impedance matching of circuit 30. Two continuously-variable capacitors 40, 44 are connected between ground and the input and output sides of sample coil 24, respectively. Two fixed-value, dynamically-replaceable capacitors 52a-b may also be connected to the input and output sides of sample coil 24, respectively, at least in some switching configurations of circuit 30. A first capacitor 52a is connected between the proximal side of coil 24 and a secondary (auxiliary) coil 54, which is in turn connected to ground. In some switching configurations, secondary coil 54 may be used to reduce the overall inductance of circuit 30, which may be desirable for example for performing $^{31}P$ NMR measurements. A second capacitor 52b is connected between the distal side of coil 24 and ground. In switching configurations other than the ones illustrated in FIG. 2-A, capacitors 52a-b may be replaced by other capacitors or by short connections, as described below.

In one embodiment, capacitors 52a-b are part of a movable switching member including three or more capacitors, as described below with reference to FIG. 3. At any given time, only two capacitors of the switching member are connected to coil 24. Capacitors 52a-b may be replaced with other capacitors using a single translation motion of the switching member. The motion of the switching member changes the values of the capacitors inserted between a set of nodes/contacts 50a-d. As illustrated by the dashed line 53, the two nodes 50a, 50c may be commonly connected to ground in some switching configurations of circuit 30; in such configurations, secondary inductor 54 may not substantially affect the rest of circuit 30.

Suitable inductance and capacitance values for the various components shown in FIG. 2-A may be chosen according to the desired NMR application. In an exemplary implementation, sample coil 24 has an inductance on the order of hundreds of mH, for example about 250 mH. Variable capacitors 40-44 may take on continuously-adjustable values on the order of pF to tens of pF, for example 1-15 pF. Capacitor 34 may have a value on the order of pF, for example about 1.5 pF. The capacitance of capacitor 38 may be adjusted to provide impedance matching to 50Ω. Capacitors 52a-b may have capacitance values on the order of pF to hundreds of pF, as described in further detail below. In an exemplary implementation, various capacitors shown in FIG. 2-A have voltage ratings of 2500 V or higher.

FIG. 2-B shows a potential arrangement within an NMR probe of various components of the circuit 30 illustrated in FIG. 2-A. Variable capacitors 40, 44 are mounted on a transverse conductive support 51, which is in turn connected to ground. Impedance-matching capacitor 38 is mounted on another transverse conductive support 51'. A set of contacts 82a-d corresponds to the nodes 50a-d illustrated in FIG. 2-A. A first pair of contacts 82a-b is positioned at a first longitudinal level, while a second pair of contacts 82c-d is positioned at a second longitudinal level, above and aligned with contacts 82a-b. A movable capacitor-switching member is used to insert short connections or capacitors having different values, as needed, between contacts 82a-b and between contacts 82c-d.

FIG. 3-A shows an isometric view of a movable capacitor-switching member 60 according to an embodiment of the present invention. Switching member 60 has a generally-elongate shape, and is capable of moving longitudinally (along the z-axis) relative to the other components of the NMR probe. Switching member 60 is formed by an assembly of several parts: a rigid slider (backbone) 62, a plurality of chip capacitors 52a-d mounted on slider 62, and a protective capacitor cover 72 disposed over capacitors 52a-d. Capacitors 52a-d are uniformly spaced longitudinally along slider 62. Switching member 60 serves as a capacitor rack, holding capacitors 52a-d and allowing capacitors 52a-d to be slid into a plurality of contact positions.

Slider 62 includes a generally-longitudinal support plate 64, a transverse contact (shorting) protrusion 66 connected to support plate 64 at the top of support plate 64, and a cylindrical longitudinal extension 68 connected to support plate 64 and positioned below support plate 64 in the NMR probe. In one embodiment, support plate 64, contact protrusion 66 and extension 68 are formed from a single monolithic piece of a rigid conductive material.

Extension 68 may include or be coupled to a computer-controlled position-adjustment mechanism capable of positioning switching member 60 at several desired longitudinal positions. In one embodiment, extension 68 includes an external helical thread, which is inserted into an outer tube having a matching helical thread and a longitudinal slot. A pin connected to extension 68 extends out through the slot. If the outer tube is rotated using a computer-controlled motor, switching member 60 is prevented from rotating by the protruding pin, and/or by contact between support plate 64 (which has a rectangular cross-section) and its exterior. As a result, switching member 60 moves longitudinally. As a skilled artisan will appreciate, various other mechanisms may be used to move switching member 60 longitudinally between several positions.

Cover 72 includes a plurality of transverse conductive contact strips 74a-e defined along the outer surface of cover 72. Each contact strip 74a-d is electrically connected to a corresponding capacitor 52a-d, while contact strip 74e is electrically connected to contact protrusion 66. The space between contact strips 74a-d is electrically insulative; the space may be defined by chemically etching away part of a copper surface layer along cover 72. The opposite longitudinal ends 76a-b of cover 72 are bent inwardly, toward support plate 64, to facilitate the longitudinal sliding motion of switching member 60. The inward bends reduce the risk that the ends of cover 72 catch on other probe components. Cover 72 reduces the mechanical damage risks posed to capacitors 52a-d.

FIG. 3-B shows a longitudinal side view of switching member 60 and part of its NMR probe environment. Switching member 60 is positioned in a longitudinal channel or aperture 61 defined between two generally longitudinal outer contact assemblies 78a-b. Switching member 60 is capable of sliding longitudinally in the channel defined between outer contact assemblies 78a-b. Outer contact assemblies 78a-b include corresponding insulative support plates 80a-b, and lower and upper contact springs 82a-b, 82c-d mounted on corresponding plates 80a-b using corresponding fasteners 86a-b, 86c-d. Contact springs 82a-d may be formed by D-shaped clips open on one side; one side of a clip may slide relative to the other in response to transverse pressure applied to the clip. Lower contact springs 82a-b are situated at the same longitudinal level. Similarly, upper contact springs 82c-d are situated at the same longitudinal level. The longitudinal spacing between lower contact springs 82a-b and upper contact springs 82c-d is equal to the spacing between capacitors 52a-d.

FIG. 3-C shows a longitudinal side view of switching member 60 facing the contact surface of cover 72. A plurality of plated through-holes 98 are defined through the insulative substrate of cover 72, along contact strips 74a-e. In one implementation, two through-holes 98 are defined along each strip 74a-e. Through-holes 98 are used to establish electrical contact between contact strips 74a-d and their corresponding capacitors 52a-d (shown in FIG. 3-A), and between contact strip 74e and the conductive protrusion 66 (shown in FIG. 3-A).

In some embodiments, slider 62 is made from palladium-coated or gold-coated copper. Other conductive materials (e.g. metals) may be suitable for slider 62. In some embodiments, slider 62 may be formed from multiple assembled parts. Contact springs 82a-d may be made of palladium-coated or gold-coated beryllium copper, which is relatively springy and non-magnetic. Other materials, such as spring steel, may also be used for contact springs 82a-d. Cover 72 may be formed by a copper-covered printed circuit board (PCB) section. In an exemplary embodiment, capacitors 52a-d have dimensions on the order of 1 cm, while switching member 60 has a longitudinal extent on the order of 10-20 cm.

Member 60 may be made by mounting capacitors 52a-d onto corresponding grooves defined in slider 62, soldering the capacitors 52a-d to slider 72, and soldering cover 72 above capacitors 52a-d. A single soldering step may be used to connect capacitors 52a-d to slider 62 and to cover 72. Alternatively, two or more soldering steps may be used. Cover 72 may be made by etching away insulative strips between conductive strips 74a-e, drilling through-holes 98 through conductive strips 74a-e, and plating through-holes 98 to establish electrical connections between the opposite sides of cover 72 along strips 74a-e. Member 60 is then mounted on its driving mechanism, and is longitudinally slid in the space defined between contacts 82a-d.

The operation of circuit 30 may be better understood with reference to FIGS. 4-A-G, which illustrate seven sequential switching configurations of switching member 60. FIG. 4-H illustrates a potential capacitance value configuration for the capacitors of member 60. Table 1 lists a number of measured resonant frequencies and theoretically-modeled resonant frequencies for an NMR circuit employing the capacitance values shown in FIG. 4-H, for the configurations shown in FIGS. 4-A-G. Table 1 also lists the capacitance values between the upper contacts 82c-d and lower contacts 82a-b for each of the positions of member 60 shown in FIGS. 4-A-G.

TABLE 1

| Configuration | Capacitance (pf, upper contact) | Capacitance (pf, lower contact) | Measured Frequency Range (MHz) | Modeled Frequency Range (MHz) |
|---|---|---|---|---|
| FIG. 4-A | None | None | 82-130 | 93-180 |
| FIG. 4-B | None | Short | 164-213 | 130-220 |
| FIG. 4-C | Short | 68 | 30-32 | 31-33 |
| FIG. 4-D | 68 | 56 | 45-49 | 46-51 |
| FIG. 4-E | 56 | 39 | 49.6-56 | 51-57 |
| FIG. 4-F | 39 | 15 | 59-70 | 62-76 |
| FIG. 4-G | 15 | None | 73-102 | 81-128 |

FIG. 4-A shows a system configuration in which member 60 does not touch contacts 82a-d. As listed in Table 1, the resulting resonant frequency range achievable by adjusting the variable capacitors 40, 44 was observed to be 82-130 MHz. A corresponding theoretical calculation yielded a range of 93-180 MHz. FIG. 4-B shows a system configuration in which member 60 shorts the lower contact terminals 82a-b together, while switching member does not touch upper contact terminals 82c-d. FIG. 4-C shows a configuration in which upper contacts 82c-d are shorted, while a capacitance value of 68 pF is introduced between lower contacts 82a-b. In the configuration of FIG. 4-D, capacitors having capacitance values of 68 pF and 56 pF are inserted between upper contacts 82c-d and lower contacts 82a-b, respectively. In the configurations of FIGS. 4-E-F, the capacitor value pairs introduced between the external contacts are (56, 39 pF) and (39, 15 pF), respectively. FIG. 4-G shows a configuration in which a 15 pF capacitor is positioned between upper contacts 82c-d, while member 60 does not touch lower contacts 82a-b.

FIG. 5-A is a schematic diagram of a tunable NMR probe circuit 130 according to another embodiment of the present invention. Circuit 130 includes a sample coil 24, variable capacitors 40, 44 and impedance-matching capacitor 38 connected as described above with reference to FIG. 2-A. In some switching configurations of circuit 130, a secondary coil 154 may be connected across the same circuit nodes as sample coil 24. The connections established between the circuit nodes 150a-e shown in FIG. 5-A in various switching configurations of circuit 130 can be better understood by considering the description below with reference to FIGS. 5-B, 6-A-D, and 7-A-F.

FIG. 5-B shows a side view of an arrangement of some of the components of the circuit of FIG. 5-A, according to an embodiment of the present invention. The physical arrangement of variable capacitors 40, 44 and impedance-matching capacitor 38 on supports 51, 51' is similar to the one described above with reference to FIG. 2-B. A first contact 182a is connected to ground, and positioned at a first longitudinal level. Contact 182a faces the dorsal (back) side of a corresponding capacitor switching member described below. A pair of contacts 182b-c are positioned at a second longitudinal level above the first level, while another pair of contacts 182d-e are positioned at a third longitudinal level above the second level. Auxiliary inductor 154 is connected between contacts 182b, d. A movable capacitor-switching member is used to insert short connections and/or capacitors having different values between contacts 182b-c and between contacts 182d-e, and to ground a switching member backbone through contact 182a.

FIG. 6-A shows an isometric view of a movable capacitance-switching member 160 suited for use in the circuit of FIG. 5-A, according to an embodiment of the present invention. FIG. 6-B shows a longitudinal side view of switching member 160. Switching member 160 is formed by an assembly of several parts: a rigid slider 162, a plurality of chip capacitors 152a-c mounted on slider 162, and a transverse-conductor extension 172 mounted on slider 162 and positioned above capacitors 152a-c. Capacitors 152a-c are uniformly spaced longitudinally along slider 162. Switching member 160 serves as a capacitor rack, holding capacitors 152a-c and allowing capacitors 152a-c to be slid into a plurality of contact positions. Slider 162 includes a generally-longitudinal support plate 164, a distal transverse contact (shorting) protrusion 166 connected to support plate 164 at the top of support plate 164, a proximal transverse contact (shorting) protrusion 165 connected to support plate 164 at the bottom of support plate 164, and a cylindrical longitudinal extension 168 connected to proximal protrusion 165 and positioned below support plate 164 in the NMR probe. The various parts of slider 162 may be formed by a single monolithic piece of palladium-plated or gold-plated copper, as described above with reference to FIG. 3-A.

Extension 172 includes an insulative support 174 mounted on slider 162, and two transverse, longitudinally-spaced conductive contact clips 176a-b mounted on support 174. Contact clips 176a-b establish respective electrical connections between the dorsal and frontal sides of switching member 160. FIG. 6-C shows an isometric view of support 174, while FIG. 6-D shows an isometric view of an exemplary clip 176a according to an embodiment of the present invention. Support 174 includes two parallel, longitudinally-spaced, transverse channels (grooves) 178a-b, sized to receive clips 176a-b, respectively. Grooves 178a-b are separated by a middle ridge 180, and are bounded externally by a slider-connector part 182 and a top cap 184, respectively. Slider-connector part 182 secures extension 172 to slider 162 (shown in FIGS. 6-A-B). Support 174 may be made of an insulative material such as polytetrafluoroethylene (PTFE, known by the trade name Teflon®). Contact clip 716 may be made of palladium-plated or gold-plated copper. Switching member 160 may also include a capacitor cover as shown in FIGS. 3-A-C.

FIGS. 7-A-E illustrate schematically several sequential positions of the switching member of FIGS. 6-A-B, and the switching circuit configurations corresponding to the switching member positions, according to an embodiment of the present invention. FIG. 7-F shows a set of capacitor values chosen for the switching member illustrated in FIGS. 7-A-E, according to an embodiment of the present invention. Table 2 lists a number of measured resonant frequencies for an NMR circuit employing the capacitance values shown in FIG. 7-F, for the configurations shown in FIGS. 7-A-E. Table 2 also lists the capacitance values between the upper contacts 182b-c and middle contacts 182d-e for each of the positions of member 160 shown in FIGS. 7-A-E. In an exemplary implementation, the configuration of FIG. 7-A is used to perform $^{13}$C NMR measurements, the configuration of FIG. 7-B is used for $^{31}$P measurements, while that of FIG. 7-E is used for $^{15}$N measurements.

TABLE 2

| Configuration | Capacitance (pF, upper contact) | Capacitance (pF, middle contact) | Measured Frequency Range (MHz) |
| --- | --- | --- | --- |
| FIG. 7-A | None | None | 139-184 |
| FIG. 7-B | Short | Short | 202-137 |
| FIG. 7-C | Short | 2 | 76-52 |
| FIG. 7-D | 2 | 47 | 86-68 |
| FIG. 7-E | 47 | 47 | 52-48 |

FIG. 7-A shows a system configuration in which switching member 160 does not touch contacts 182a-e. As listed in Table 2, the resulting resonant frequency range achievable by adjusting the variable capacitors 40, 44 was observed to be 139-184 MHz. FIG. 7-B shows a system configuration in which member 160 shorts the contacts of each pair 182b-c, 182d-e together (i.e. shorts the nodes 150b-c and 150d-e shown in FIG. 5-A, respectively). In the configuration of FIG. 7-B, auxiliary inductor 154 is introduced into the NMR measurement circuit between the same voltage nodes as sample coil 24. Introducing auxiliary inductor 154 into the circuit as shown in FIG. 7-B lowers the overall inductance of the circuit, and increases the achievable maximum resonant frequency. The resulting resonant frequency range was observed to be 137-202 MHz. FIG. 7-C shows a configuration in which upper contacts 182d-e are shorted together and grounded through lower contact 182a, while a capacitance value of 2 pF is introduced between the middle contacts 182b-c, i.e. between the proximal side of coil 24 and ground. In the configuration of FIG. 7-D, capacitors having capacitance values of 2 pF and 47 pF are inserted between upper contacts 182d-e and middle contacts 182b-c, respectively, while contact 182a is used to ground slider 160. In the configuration of FIG. 7-E, capacitors having capacitance values of 47 pF and 47 pF are inserted between upper contacts 182d-e and middle contacts 182b-c, respectively, while contact 182a is used to ground slider 160.

FIG. 8 shows a longitudinal view of a capacitance-switching member 260 according to another embodiment of the present invention. Capacitance switching member 260 includes slider 64 and capacitors 52a-d mounted on slider 64 as described above with reference to FIG. 3-A. A plurality of insulative intercapacitor blocks 265a-e are positioned in the spaces between capacitors 52a-d and slider 64. Intercapacitor blocks 265a-e perform a protective function similar to that of protective cover 72 (shown in FIG. 3-A). Intercapacitor blocks 265a-e may be made of a plastic or resin such as an amorphous thermoplastic polyetherimide sold by General Electric under the trade name Ultem®.

FIG. 9-A is a schematic diagram of a switching circuit 330 according to another embodiment of the present invention. Circuit 330 includes a sample coil 24, an input terminal 36 for receiving external excitation pulses, a variable impedance-matching capacitor 38 connected between input terminal 36 and the input (proximal) side of sample coil 24, a variable capacitor 40 connected between ground and the input side of sample coil 24, and a capacitance-switching assembly 360 connected across sample coil 24, for switching the achievable resonant frequency range of circuit 330. The capacitance of capacitor 38 may be adjusted in order to optimize the impedance matching of circuit 30.

Capacitance-switching assembly 360 includes an input-side capacitor column 350a comprising a first capacitor chain connected in series between the input side of coil 24 and ground, and an output-side capacitor column 350b comprising a second capacitor chain connected in series between the output side of coil 24 and ground. A switch schematically illustrated at 353 is capable of connecting the output side of coil 24 directly to ground. A plurality of switching connections 354 may be established between corresponding inter-capacitor node pairs of the two columns 350a-b, as shown in FIG. 9-A. In some embodiments, the two capacitors in each pair defined by a longitudinal level may have identical capacitance values, while capacitor pairs at different longitudinal levels may have different capacitance values.

FIG. 9-B shows a longitudinal side view of a capacitance-switching assembly 360 suited for use in switching circuit 330 according to an embodiment of the present invention. Switching assembly 360 includes two generally-longitudinal, parallel capacitor columns 350a-b. Each column 350a-b includes a plurality of stacked, soldered chip capacitors, with a contact clip attached to each inter-capacitor interface. Consider for example four such capacitors 352a-d. Capacitors 352a-b may have an identical capacitance value different from the capacitance value of capacitors 352c-d. Capacitors 352a,c are connected by a solder connection 355a, while capacitors 352b,d are connected by a solder connection 355b. Two contact springs (clips) 357a-b are also coupled to the solder connections 355a-b, respectively. Contact clips 357a-b protrude transversely between the two columns 350a-b, at the longitudinal level of a corresponding intercapacitor interface. A slidable contact member 359 is positioned between columns 350a-b, and is capable moving longitudinally between columns 350a-b. Contact member 359 includes two electrically-interconnected contact springs (clips) 361a-b each capable of contacting a corresponding clip 355a-b when contact member 359 is positioned at an appropriate longitudinal level between columns 350a-b. The electrical connections established by contact member 359 corresponds to the switch connections illustrated at 354 in FIG. 9-A.

When contact member 359 is positioned close to sample coil 24, a relatively high equivalent capacitance is established across sample coil 24. When contact member 359 is positioned at lower positions, the multiple capacitors connected in series yield a lower equivalent capacitance established across sample coil 24. Suitable capacitance values for the capacitors of columns 350a-b may be chosen by a skilled artisan to yield a desired frequency tuning range for each switching position of contact member 359.

The preferred systems and method described above allow the computer-controlled tuning of the resonant frequency range of an NMR circuit by inserting and/or removing capacitors having different capacitance values into/from the circuit. Establishing or changing a contact state of two different capacitors using a single longitudinal motion of a switching member as described above allows packing the NMR circuit components relatively closely, which is of particular interest in a space-constrained NMR probe environment. Available space savings may also be used to accommodate larger capacitors, which in turn may have higher voltage ratings. A capacitor cover or intercapacitor protective blocks may be used to improve the reliability of the switching assembly, which in practical applications may need to function over thousands of switching cycles without appreciable degradation in performance. Furthermore, it was observed that establishing sliding electrical contacts over one or more solder surfaces may lead to substantial degradation in switch performance as the switch cycles between different positions. The preferred switching assembly designs described above allow the use of relatively robust, reliable conductive contact surfaces.

In some embodiments, such as the one illustrated in FIG. 2-A, an auxiliary inductor may be connected between the sample coil and ground. In other embodiments, such as the one illustrated in FIG. 5-A, an auxiliary inductor may be connected across the same nodes as the sample coil. It was observed that connecting an auxiliary inductor across the same nodes as the sample coil allows achieving superior NMR measurement performance (improved pulse widths). In some embodiments, depending on the desired application, an auxiliary inductor need not be used.

The above embodiments may be altered in many ways without departing from the scope of the invention. For example, a capacitor cover or one ore more intercapacitor protective blocks may be used with various switching member geometries, including the particular geometries described above. An NMR circuit such as the ones described above may or may not include an auxiliary inductor. Various driving mechanisms may be used to move a switching member longitudinally. A slider may include several conductive sections insulated from each other, and different capacitors along the slider need not share a connection to a common node. Accordingly, the scope of the invention should be determined by the following claims and their legal equivalents.

The invention claimed is:

1. A nuclear magnetic resonance apparatus comprising:
a nuclear magnetic resonance sample coil; and
a switching assembly electrically connected to the sample coil, comprising
 a first pair of contacts disposed along a longitudinal channel, at least one contact of the first pair of contacts being electrically connected to the sample coil,
 a second pair of contacts disposed along the longitudinal channel and spaced apart longitudinally relative to the first pair of contacts, at least one contact of the second pair of contacts being electrically connected to the sample coil, and
 a longitudinally-movable switching member comprising a plurality of longitudinally-spaced capacitors including three or more capacitors, the switching member being positioned in the longitudinal channel such that different subsets of two capacitors selected from the plurality of capacitors are capable of being inserted between the first pair of contacts and between the second pair of contacts, wherein a longitudinal motion of the switching member alters a contact state of at least two of the different subsets of the capacitors with the first pair of contacts and the second pair of contacts, thereby adjusting a resonant frequency of a nuclear magnetic resonance measurement circuit including the sample coil.

2. The apparatus of claim 1, wherein the switching member includes a conductive rigid backbone including a shorting transverse protrusion sized to short together the first pair of contacts when positioned between the first pair of contacts.

3. The apparatus of claim 1, wherein the switching member comprises:
 a rigid backbone, the plurality of capacitors being mounted on the rigid backbone; and
 a protective cover mounted on the capacitors opposite the rigid backbone.

4. The apparatus of claim 3, wherein the protective cover has an outer surface including a plurality of conductive transverse strips separated by insulative regions, at least one of the conductive transverse strips being electrically connected to one of the plurality of capacitors.

5. The apparatus of claim 1, wherein the switching member further comprises a plurality of protective insulative intercapacitor blocks disposed between the plurality of capacitors.

6. The apparatus of claim 1, wherein the switching member further comprises a longitudinal extension spaced apart longitudinally relative to the plurality of capacitors, the longitudinal extension including an insulative support and a transverse shorting conductor mounted on the insulative support, the transverse shorting conductor being sized to short together the first pair of contacts when positioned between the first pair of contacts.

7. The apparatus of claim 1, further comprising an auxiliary inductor connected to at least one contact selected from the first pair of contacts and the second pair of contacts.

8. The apparatus of claim 1, wherein each of the contacts of the first pair of contacts and the second pair of contacts includes a conductive clip spring positioned to contact the switching member.

9. The apparatus of claim 1, further comprising:
 a first variable capacitor connected between a first terminal of the sample coil and ground; and
 a second variable capacitor connected between a second terminal of the sample coil and ground.

10. The apparatus of claim 9, further comprising an auxiliary inductor connected between a contact of the first pair of contacts and a contact of the second pair of contacts, opposite the sample coil relative to the first pair of contacts and the second pair of contacts.

11. A nuclear magnetic resonance method comprising:
adjusting a resonant frequency of a nuclear magnetic resonance measurement circuit by performing a longitudinal motion of a switching member disposed in a longitudinal channel defined between a first pair of contacts and a second pair of contacts, at least one contact of the first pair of contacts and at least one contact of the second pair of contacts being electrically connected to a sample coil, the switching member including a plurality of longitudinally-spaced capacitors including three or more capacitors, the longitudinal motion altering a contact state of at least two of the different subsets of capacitors with the first pair of contacts and the second pair of contacts such that the longitudinal motion inserts different subsets of two capacitors selected from the plurality of capacitors between the first pair of contacts and between the second pair of contacts; and
performing a nuclear magnetic resonance measurement on a sample inserted into the sample coil.

12. A nuclear magnetic resonance apparatus comprising:
a nuclear magnetic resonance sample coil; and
a switching assembly electrically connected to the sample coil, comprising
 a first longitudinal capacitor column comprising a plurality of first capacitors connected in series, and a plurality of transversely-protruding first contacts connected to a corresponding plurality of intercapacitor interfaces defined between the first capacitors.
 a second longitudinal capacitor column comprising a plurality of second capacitors connected in series, and a plurality of transversely-protruding second contacts connected to a corresponding plurality of intercapacitor interfaces defined between the second capacitors, the second capacitor column being aligned with and transversely spaced relative to the first capacitor column, and a longitudinally-movable switching member positioned in a switching channel defined between the first capacitor column and the second capacitor column, the switching member selectively establishing an electrical connection between a selected first contact and a selected second contact when positioned between the selected first contact and the selected second contact.

13. The apparatus of claim 1, wherein the longitudinal motion of the switching member is bi-lateral motion.

14. The apparatus of claim 11, wherein the longitudinal motion of the switching member is bi-lateral motion.

* * * * *